United States Patent
Belyansky et al.

(10) Patent No.: US 6,890,833 B2
(45) Date of Patent: May 10, 2005

(54) TRENCH ISOLATION EMPLOYING A DOPED OXIDE TRENCH FILL

(75) Inventors: Michael Belyansky, Bethel, CT (US); Andreas Knorr, Austin, TX (US); Oleg Gluschenkov, Poughkeepsie, NY (US); Christopher Parks, Poughkeepsie, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/397,761

(22) Filed: Mar. 26, 2003

(65) Prior Publication Data

US 2004/0192009 A1 Sep. 30, 2004

(51) Int. Cl.[7] .............................................. H01L 21/76
(52) U.S. Cl. ........................................................ 438/426
(58) Field of Search ................................. 438/424, 428, 438/426

(56) References Cited

U.S. PATENT DOCUMENTS

| 4,599,136 | A | * | 7/1986 | Araps et al. ................ 438/424 |
| 5,578,518 | A | * | 11/1996 | Koike et al. ................ 438/424 |
| 5,994,200 | A | | 11/1999 | Kim |
| 6,010,948 | A | * | 1/2000 | Yu et al. ..................... 438/436 |
| 6,027,983 | A | | 2/2000 | Hashimoto et al. |
| 6,143,626 | A | | 11/2000 | Yabu et al. |
| 6,465,325 | B2 | | 10/2002 | Ridley et al. |
| 6,469,336 | B2 | | 10/2002 | Deboer et al. |
| 2003/0019427 | A1 | * | 1/2003 | Ghanayem et al. ......... 118/712 |

FOREIGN PATENT DOCUMENTS

JP          04-320354    *   4/1991    ........... H01L/21/76

OTHER PUBLICATIONS

Stanley Wolf Silicon Processinf for the VSLI Era vol. 4 Lattice Press 2002 pp. 453 and 459).*
Stanley Wolf Silicon Processinf for the VSLI Era vol. 3 Lattice Press 1995 pp. 641.*

* cited by examiner

Primary Examiner—David S. Blum
(74) Attorney, Agent, or Firm—Slater & Matsil, L.L.P.

(57) ABSTRACT

A trench isolation structure is formed in a substrate. One or more openings are formed in a surface of the substrate, and a liner layer is deposited at least along a bottom and sidewalls of the openings. A layer of doped oxide material is deposited at least in the openings, and the substrate is annealed to reflow the layer of doped oxide material. Only a portion near the surface of the substrate is removed from the layer of doped oxide material in the opening. A cap layer is deposited atop a remaining portion of the layer of doped oxide material in the opening.

15 Claims, 12 Drawing Sheets

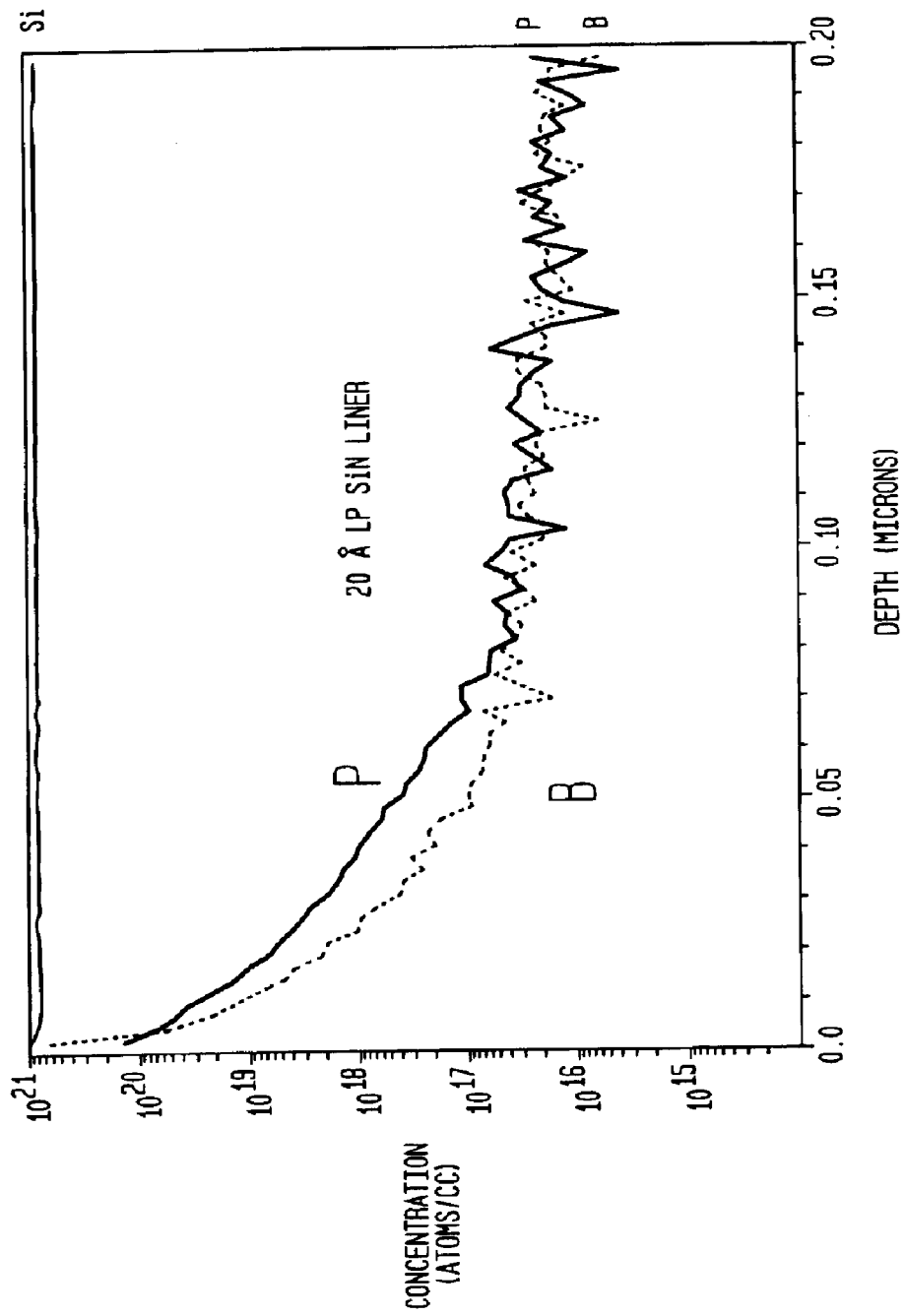

TRENCH ISOLATION EMPLOYING A DOPED OXIDE TRENCH FILL

BACKGROUND OF THE INVENTION

The present invention is directed to semiconductor integrated circuit devices and, more particularly, to processes for the fabrication of semiconductor integrated circuit devices that include isolation trenches for low leakage transistors.

Various isolation methods have been employed to electrically isolate one or more semiconductor device elements formed in a substrate from other device elements. Such methods have included p-n junction isolation and localized oxidation of silicon (LOCOS). As newer generations of semiconductor device features become increasingly smaller and the number of elements increased, these known methods are often unsuitable or are increasingly difficult to be manufactured in a controllable manner. To isolate such smaller and more highly integrated semiconductor device elements, trench isolation is commonly employed in which a trench is formed in a semiconductor substrate and surrounds the region that is to be electrically isolated and an insulating material is filled in the trench.

A class of ultra-low leakage transistors, known as pass transistors, is widely used in dynamic random access memory (DRAM) arrays for access to the stored charge. With decreasing memory cell size and reduced operating voltage, the stored charge in a cell ranges from about 10,000 to 100,000 elemental electron charges or from about 6 to 60 fC. To retain a large portion of such low charge for a reasonable amount of time (typically hundreds of milliseconds), the leakage current in each cell should be smaller than 10 fA. Various device isolation techniques can influence the leakage current in such ultra-low leakage regime.

To form the isolation trench, one or more etch masking layers are typically deposited on a semiconductor substrate, and then a photoresist film is deposited on the etch masking layer and patterned. Selected regions of the etch masking layer are then removed and expose areas of the semiconductor substrate. The exposed areas of the semiconductor substrate are then etched to a desired depth, and an insulating material is deposited to fill the trench. Any insulating material that is deposited outside of or above the opening of the trench may then be removed. Also, the etch masking material may then be removed or may be removed prior to the deposition of the insulating material.

As the size of semiconductor device features has further decreased, the width of the isolation trenches have likewise decreased. The depth of the isolation trenches is defined by the depth of the various devices formed in the substrate and by the minimum isolation trench perimeter needed to provide effective isolation between the devices. Accordingly, the trench depth may be increased to keep a constant trench perimeter between the devices, for example. The ratio of the trench height to the trench width, known as the aspect ratio, is also increased. Further, three-dimensional (3D) integration of the devices requires even deeper isolation trenches, resulting in even higher aspect ratios. As an example, a DRAM cell may employ a vertical access transistor stacked on top of the storage capacitor. The isolation trench for such a vertical transistor DRAM cell must be deep enough to isolate the lower junction of the vertical pass transistor. For a vertical DRAM cell made with a semiconductor technology employing a 100 nm minimal feature size, for example, the aspect ratio of isolation trenches is approximately 10:1.

When an insulating material, such as a high density plasma (HDP) oxide, is deposited in a trench having such an aspect ratio, voids or seams are often formed within the insulating material located in the trench. The voids may be located entirely below the surface of the semiconductor substrate such that the insulating properties of the isolation trench and the insulating material are degraded. Alternatively, the voids may extend above the surface of the semiconductor substrate so that when the device is subsequently planarized, a seam is opened in the insulating material that may be subsequently filled with a polysilicon film or other conducting material that creates shorts between device elements.

It is therefore desirable to provide a trench isolation process wherein the trench is filled with an insulating material in a manner that prevents the formation of voids and seams.

As an alternative, doped oxides such as borophosphosilicate glass (BPSG) may be used to fill the isolation trenches. Because such doped oxides soften and reflow when subjected to high temperatures, the high aspect ratio trenches may be filled with a doped oxide and then subjected to a high temperature anneal that reflows the doped oxide and eliminates the voids and seams that are formed when the doped oxide is deposited in the trench. The use of such doped oxides, however, has the disadvantage that dopants in the oxide, such as boron, arsenic, or phosphorus, may diffuse out of the doped oxide and into the device regions during the anneal step and other subsequent high temperature processing steps and change the characteristics of the devices. Moreover, such doped oxides have the disadvantage of a high etch rate when exposed to wet solvents, such as acids, and thus cannot be etched in a readily controllable or repeatable manner.

Another known alternative is described in U.S. Pat. No. 6,143,626, to Yabu et al. and titled "Method Of Manufacturing A Semiconductor Device Using A Trench Isolation Technique." A trench is formed in a semiconductor substrate, and an underlying insulating film composed of a high temperature oxide (HTO) film is formed on the substrate. A reflowable film is then deposited with a thickness greater than about one-half of the depth of the trench and is subsequently reflowed by a thermal treatment to eliminate voids. The reflowable film is then etched back so that only a small portion of the film remains at the bottom of the trench. Next, a silicon dioxide film is deposited at a thickness greater than the depth of the trench to form an insulating film that fills the trench. In this scheme, when a doped oxide is used as a reflowable film, the HTO diffusion barrier film must be thick enough to prevent dopant penetration into the device regions. As an example, a typical thermal treatment during transistor fabrication includes high-temperature dopant activation steps conducted at between 950° C.–1050° C. The HTO layer has to be at least 400–600 Å thick to substantially stop any dopant penetration from the oxide into the silicon substrate. Because current state-of-the-art fabrication processes use isolation trenches that are only 100 nm wide, substantial protection from dopant penetration is not practical when the reflowable material is a highly doped oxide. Thus, the process is not suitable for trenches having increasingly smaller feature sizes (of about 120 nm or less) and higher aspect ratios (of about 5 or larger).

Furthermore, the isolation materials and their related deposition processes have specific requirements for use in ultra-low leakage applications such as DRAM arrays. The electrical leakage associated with impurity, structural, and surface defects in the transistor junctions must be minimized to increase its charge retention characteristics. Surface dangling bonds and associated electron traps near the silicon mid-gap energy level at a silicon/isolation trench boundary are typically minimized by growing a high-quality thermal silicon oxide. The thermal oxidation of silicon has been employed in the art for the past thirty years to produce nearly perfect silicon oxide/silicon interface. For a typical thermally grown silicon oxide, the interface density of traps at silicon mid-gap energy is about or less than 1E11 $cm^{-2}eV^{-1}$ (and typically about 3E10 $cm^{-2}eV^{-1}$) on a (100) plane of silicon crystal. The surface density of traps at the silicon mid-gap energy level of less than about 5E11 $cm^{-2}eV^{-1}$ is highly desirable for ultra-low leakage applications.

A known doped oxide, BPSG, exhibits ion gettering property. That is, mobile metal ions (e.g. K+, Na+) diffuse into BPSG layer and quickly chemically bind to phosphorus atoms within the glass matrix. Therefore, a BPSG material located in the vicinity of transistor junction region can adsorb metallic contamination from the junction, thus reducing transistor leakage. The only requirement for efficient ion gettering by BPSG is the ability of ions to diffuse into the BPSG layer. Such a requirement may be satisfied when the mobile ions do not encounter any substantial diffusion barrier between the BPSG layer and the active area of the transistor.

It is therefore desirable to provide trench isolation materials that both avoid the formation of voids and seams as well as are not subject to dopant diffusion and high wet etch rates and reduce transistor off current.

SUMMARY OF THE INVENTION

The present invention provides an isolation trench in which a reflowed doped oxide material is employed to fill the trench in a void-free manner, a thin liner layer is used to line the walls and bottom of the trench and serves as an effective diffusion barrier for oxide dopants while being transparent to the mobile ions, and a thin capping layer is utilized to protect the doped oxide from wet etch treatments as well as to serve as a diffusion barrier. In addition, the thin liner has an acceptable interface quality (as determined by the interface density of states at silicon mid-gap energy) that is compatible with ultra-low leakage applications.

In accordance with an aspect of the invention, a trench isolation structure is formed in a substrate. At least one opening is formed in a surface of the substrate, and a liner layer is formed at least along a bottom and sidewalls of the opening. A layer of doped oxide material is deposited at least in the opening, and the substrate is annealed to reflow the layer of doped oxide material within the opening. Only a portion near the surface of the substrate is removed from the layer of doped oxide material in the opening, and a cap layer atop a remaining portion of the layer of doped oxide material is deposited in the opening.

According to another aspect of the invention, a trench isolation structure is formed in a substrate. At least one opening is formed in a surface of the substrate and has a depth-to-width aspect ratio of at least 5:1. A thin high-quality silicon oxide layer of about 100 Å or less in thickness is grown thermally on at least sidewalls of the opening. A silicon nitride (SiN) liner layer is deposited at least along a bottom and sidewalls of the opening and has a thickness of at least 60 Å but no more than 200 Å. A layer of doped oxide material is deposited in the opening, and the substrate is annealed at a temperature of at least 800° C. for at least 10 minutes to reflow the layer of doped oxide material within the opening. About a 500 Å thick portion near the surface of the substrate is removed from the layer of doped oxide material in the opening. A layer of high-density plasma (HDP) deposited oxide is deposited atop a remaining portion of the layer of doped oxide material in the opening.

According to yet another aspect of the invention, a trench isolation structure is disposed in a substrate. At least one opening is disposed in a surface of the substrate and has a depth-to-width aspect ratio of at least 5:1. A thin high-quality silicon oxide layer of about 100 Å or less in thickness is grown thermally on at least sidewalls of the opening. A silicon nitride (SiN) liner layer is disposed at least along a bottom and sidewalls of the opening and has a thickness of at least 60 Å but no greater than 200 Å. A layer of reflowed, doped oxide material is disposed in the opening and fills substantially all of the opening except for about a 500 Å thick region near the surface of the substrate. A layer of high-density plasma (HDP) deposited oxide is disposed in the opening atop the layer of doped oxide material.

The foregoing aspects, features and advantages of the present invention will be further appreciated when considered with reference to the following description of the preferred embodiments and accompanying drawings.

BRIEF DESCRIPTION OF THE DRAWINGS

FIG. 3 shows secondary ion mass spectroscopy (SIMS) depth profiles of phosphorus (P) and boron (B) concentrations in a crystalline silicon substrate after a 1050° C., 30 second anneal of a BPSG layer that is separated from the substrate by a 20 Å thick layer of SiN.

DETAILED DESCRIPTION

Figure 1:
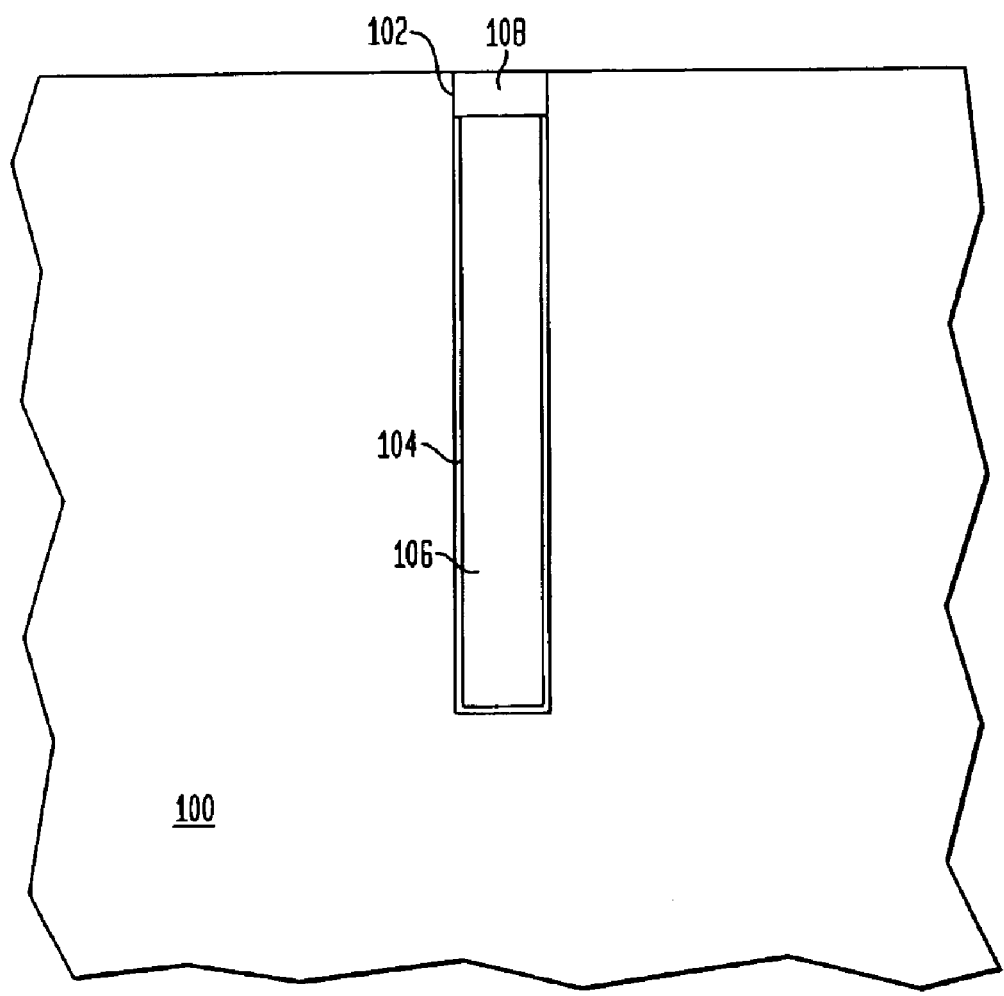
FIG. 1 is cross-sectional diagram illustrating a portion of a semiconductor substrate that includes a trench isolation structure in accordance with an aspect of the invention.

FIG. 1 shows a cross-sectional view of a portion of a substrate in which a trench structure is formed in accordance with the invention. A trench 102 having an aspect ratio of at least 5:1 is formed in a semiconductor substrate 100. The bottom and sidewalls of the trench 102, except for the uppermost portion of the trench, is lined with a thin liner material 104, which is typically a high-quality silicon oxide ($SiO_2$) layer of about 100 Å thickness that is covered with an about 60–200 Å thick layer of silicon nitride (SiN).

The high-quality silicon oxide formed next to the substrate 100 ensures a low leakage (i.e., low trap generation)

current of typically less than about 50 fA/$\mu^2$. To obtain such a low leakage current, a substantially good interface is needed between the substrate 100 and the liner 104. The interface quality is determined by measuring the density of mid-gap the energy states at the silicon interface which is an indication of the number of charge traps and/or dangling bonds at the interface. A density of energy states of below 5E11 $cm^{-2}eV^{-1}$ is preferred at the mid-gap energy of an interface between a silicon substrate 100 and a liner layer 104.

Thermal silicon oxide is known to provide a high-quality interface with a crystalline silicon substrate. For a typical thermally grown silicon oxide, the interface density of traps at the silicon mid-gap energy is about, or less than, 1E11 $cm^{-2}eV^{-1}$ and is typically about 1E10 $cm^{-2}eV^{-1}$ for the (100) crystallographic plane of the silicon. The other crystallographic plane of silicon, (110), is typically present in the isolation structures and has a slightly higher interface density of states, by about a factor of two to three. Accordingly, the layer of thermal silicon oxide in the liner 104 provides for the high-quality interface. Also, the SiN portion of the liner 104 provides an efficient diffusion barrier.

The bottom portion of the trench 102 is also filled with a reflowed doped oxide material 106 that is without voids or seams. The doped oxide is typically BPSG, though other doped oxides may be used, such as phosphosilicate glass (PSG), borosilicate glass (BSG), arsenic-doped silicon dioxide or ion implanted silicon dioxide. The uppermost portion of the trench, near the upper surface of the semiconductor substrate 100, is filled with a capping layer 108 on top of the doped oxide, such as a 500 Å thick layer of high density plasma (HDP) deposited oxide. The liner layer 104 and the capping layer 108 serve as diffusion barriers to prevent the diffusion of dopants, such as boron, phosphorous or arsenic dopants, from the doped oxide during a reflow process or during other thermal processes. In addition, the liner material 104 is selected to allow for efficient diffusion of mobile metal ions through the liner 104. The capping layer 108 also protects the doped oxide from wet etchants during subsequent processing steps.

Figure 2A:
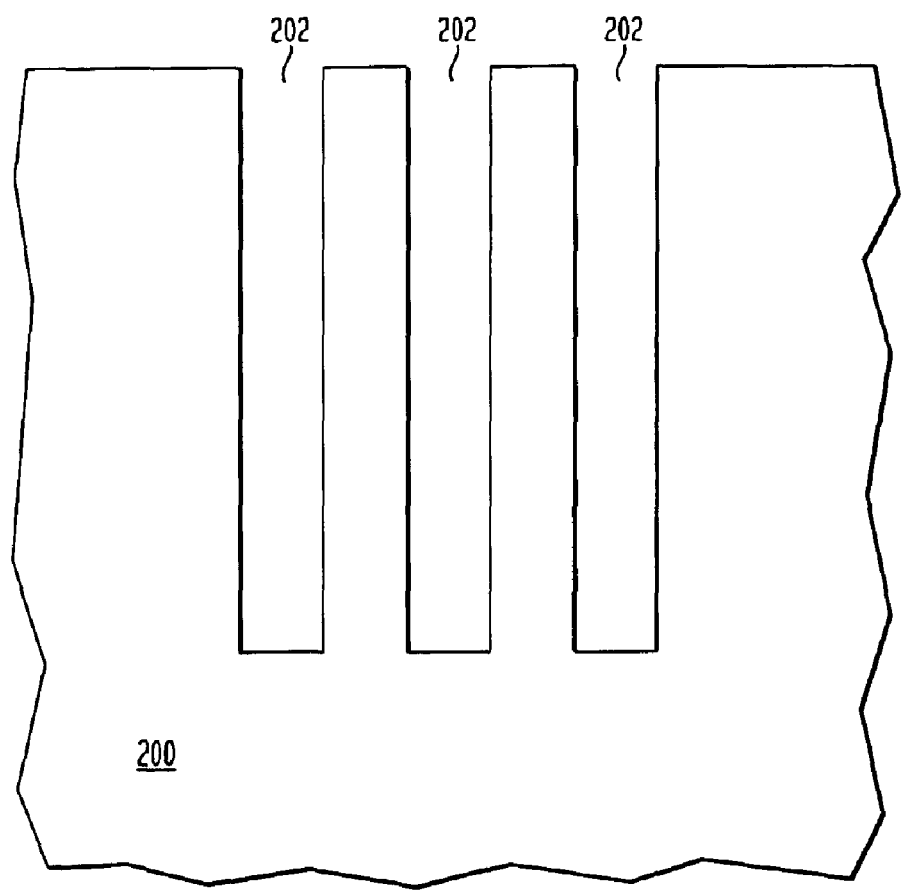
FIGS. 2A–2F are cross-sectional diagrams illustrating the process steps for forming trench isolation structures in a region of a semiconductor substrate in accordance with a process of the invention.

FIGS. 2A–2F illustrate a sequence of process steps for fabricating the trench structure of the invention. First, as FIG. 2A shows, one or more trenches 202 are etched, typically with a height-to-width aspect ratio of at least 5:1. As an example, 100 nm wide trenches may be etched with a depth of about 600 nm. For illustrative purposes, three trenches are shown which are separated from one another by a distance equal to the widths of the trenches. However, the process of the invention is also suitable for individual trenches or for trenches having other spacings. The width of the trenches etched on a single substrate can also vary widely depending on the specific device application.

The trenches 202 may be formed in the substrate 200 in a known manner. Typically, one or more etching mask layers are first deposited on the surface of the substrate 200, such as a thin silicon dioxide film followed by a thicker silicon nitride film. An optional hard mask layer or layers may also be present atop of the silicon nitride layer. Such hard mask layer or layers may include various doped oxides such as BPSG, BSG, PSG, FSG, or the like, and/or amorphous silicon layers. An anti-reflective coating may be optionally added atop the hard mask layers to assist a subsequent high-resolution lithography step by altering the reflective property of the overall layer stack.

Then, a resist film is deposited atop the etch masking layer or layers and is exposed and developed in a known manner to form openings to the etch masking layer or layers. Another anti-reflective coating layer may optionally be added atop the resist layer prior to exposure. Such a top antireflective layer can further assist the high-resolution lithography step. Multiple light exposures may be employed to better define or transfer the various fine-sized features. The exposed portions of the etch masking layers are then etched, and the resist layer may be removed. The plurality of dissimilar masking layers allow for greater flexibility in switching etch chemistries and for improving selectivity for each etch process with respect to its underlying layers.

Thereafter, the regions of the semiconductor substrate that are exposed by the openings in the etch mask layer or layers are etched to form the trenches 202. Some or all of the etch mask layers may then be removed. In one embodiment, a doped oxide hard mask layer is removed, but the pad SiN remains in place until the structures are completely planarized by CMP.

Figure 2B:
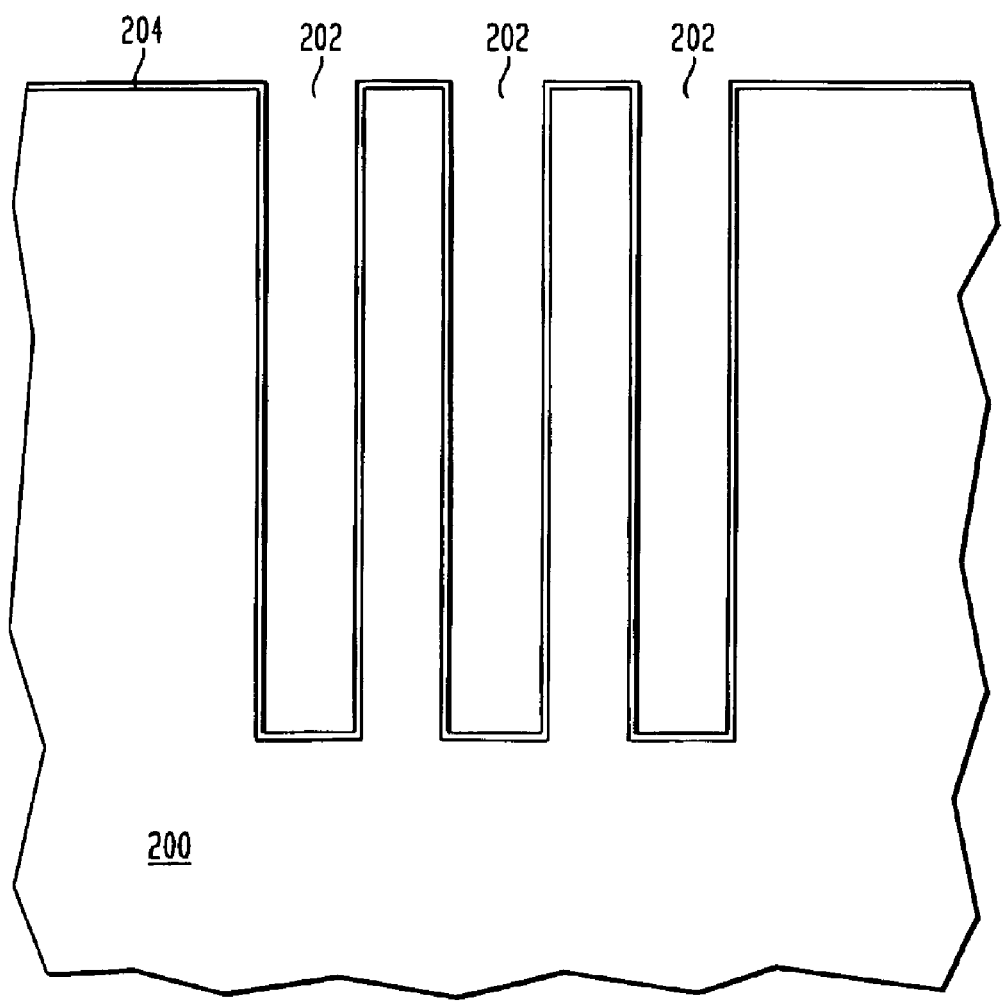

Then, as FIG. 2B shows, a thin layer of thermally grown silicon oxide is formed on the trench walls. Prior to the oxide growth, the wafer surface (including the trench walls) is preferably cleaned to remove any organic or metallic contaminants. The pre-oxidation clean may include an oxygen-bearing (e.g. molecular oxygen or ozone) plasma treatment to remove any organic polymers and/or may include an industry standard RCA clean sequence to remove ionic and organic contamination. The wafer surface may also be chemically oxidized to seal the surface with a 10–20 Å thick oxide layer. The chemically deposited oxide prevents surface contamination during wafer transfer into an oxidation tool.

The oxidation tool can be either a batch reactor, such as an oxidation furnace, or a single wafer tool, such as a rapid thermal processor (RTP). The oxide is thermally grown by heating the wafer in the presence of an oxygen-bearing gas, such as $O_3$, $O_2$, $N_2O$, or NO, at a temperature typically in the range of 500° C. to 1100° C. Radical-assisted thermal oxidation can also be employed wherein oxygen radicals are first created from an oxygen-bearing gas using an excitation process. The radical assisted oxidation can be carried out at a temperature ranging from room temperature (about 25° C.) to 1100° C. The process time, the process temperature, and the partial pressure of the primary oxidizing agent are chosen so that an oxide layer of about 20 Å to about 100 Å is grown. Because higher oxidation temperatures result in a lower interface density of states, oxidation temperatures in excess of 800° C. are preferred.

The rate of the subsequent wafer cool down can also affect the interface density of states. A lower cool down rate generally results into a lower interface density of states so that a cool down rate of less than about 5° C./minute is preferred.

For radical-assisted oxidation, however, the cool down rate has less of an effect on the interface density of states thereby allowing for a high rate of cooling without any detrimental effect on the oxide quality. As an example, an in-situ steam generation (ISSG) process may be used to create oxygen radicals in an RTP reactor by a multi-step chemical reaction of molecular hydrogen and oxygen at a reduced pressure. At cooling rates of 10–50° C./second, the ISSG process produces an oxide with an interface density of states comparable to that of a typical furnace process.

Subsequent processing steps can also modify the quality of the interfacial oxide. As an example, the small hydrogen atom can bind onto a dangling bond at the interface. During the standard forming-gas anneal used at the end of fabrication process, the small hydrogen molecules diffuse quickly at relatively low anneal temperatures (typically 400–500° C.) through a relatively thick layer of interconnects to repair the oxide interfaces. Also, a forming-gas or hydrogen anneal can improve the quality of the interfacial oxide. Moreover, high-temperature anneal steps are also known to improve the interfacial quality of the oxide. The oxide layer becomes viscous at temperatures higher than about 950° C. and relaxes mechanical stresses which, as a result, reduces the number of stress-induced dangling bonds and fixed charges at or in the vicinity of the interface.

Other ensuring processing steps can degrade the interfacial quality of the oxide. For example, a large pile-up of the nitrogen at the interface increases the interface density of states. Accordingly, the number of nitrogen atoms at the interface should be preferably less than about 25% of the number of oxygen atoms at the interface.

According to the present invention, the oxide layer is covered with a deposited silicon nitride layer. The minimum oxide thickness is then defined by the SiN deposition process. The oxide should be thick enough to prevent excessive nitrogen accumulation at the silicon/silicon oxide interface. Depending on the deposition temperature of the silicon nitride and the particular nitrogen precursor, the minimum oxide thickness is between 20 Å and 50 Å. The maximum oxide thickness is typically limited to avoid an undesirable increase of the trench aspect ratio. As an example, a 100 Å thick liner increases the aspect ratio of a 100 nm-wide trench by 20%.

A thin silicon nitride liner layer 204, which is typically from about 60 to about 200 Å thick, is deposited on the sidewalls and bottom of the trenches 202 as well as on the top surface of the semiconductor substrate 200 using chemical vapor deposition (CVD) or other known methods. In one embodiment, the silicon nitride liner is deposited by low pressure chemical vapor deposition (LPCVD) in a furnace reactor. The preferred temperature range for the LPCVD process is from 600° C. to 800° C., and the preferred chemical precursors for the LPCVD process are DCS (dichlorosilane) and ammonia ($NH_3$) at a preferred reactor pressure of below 1 Torr. An LPCVD process at a lower temperature may result in a less dense silicon nitride film that contains a high amount of hydrogen and/or silicon. Such hydrogen or silicon rich films are poor diffusion barriers. Also, a higher deposition temperature may cause a large pile-up of nitrogen at the interface, as described above.

Other process conditions and reactors are also suitable. For example, a low-temperature atomic layer or pulsed CVD reactors can grow a high-quality silicon nitride film at temperatures below 500° C.

The oxide/nitride stack can be optionally annealed to improve both the quality of the oxide interface and the ability of silicon nitride to be an efficient diffusion barrier. Such an anneal can be conducted in a neutral ambient (e.g. $N_2$ or Ar) or in a nitridizing ambient (e.g. $NH_3$ or atomic nitrogen). The preferred anneal temperature ranges from 900° C. to 1100° C., and the preferred anneal time ranges from 1 second to 1 hour.

Figure 2C:
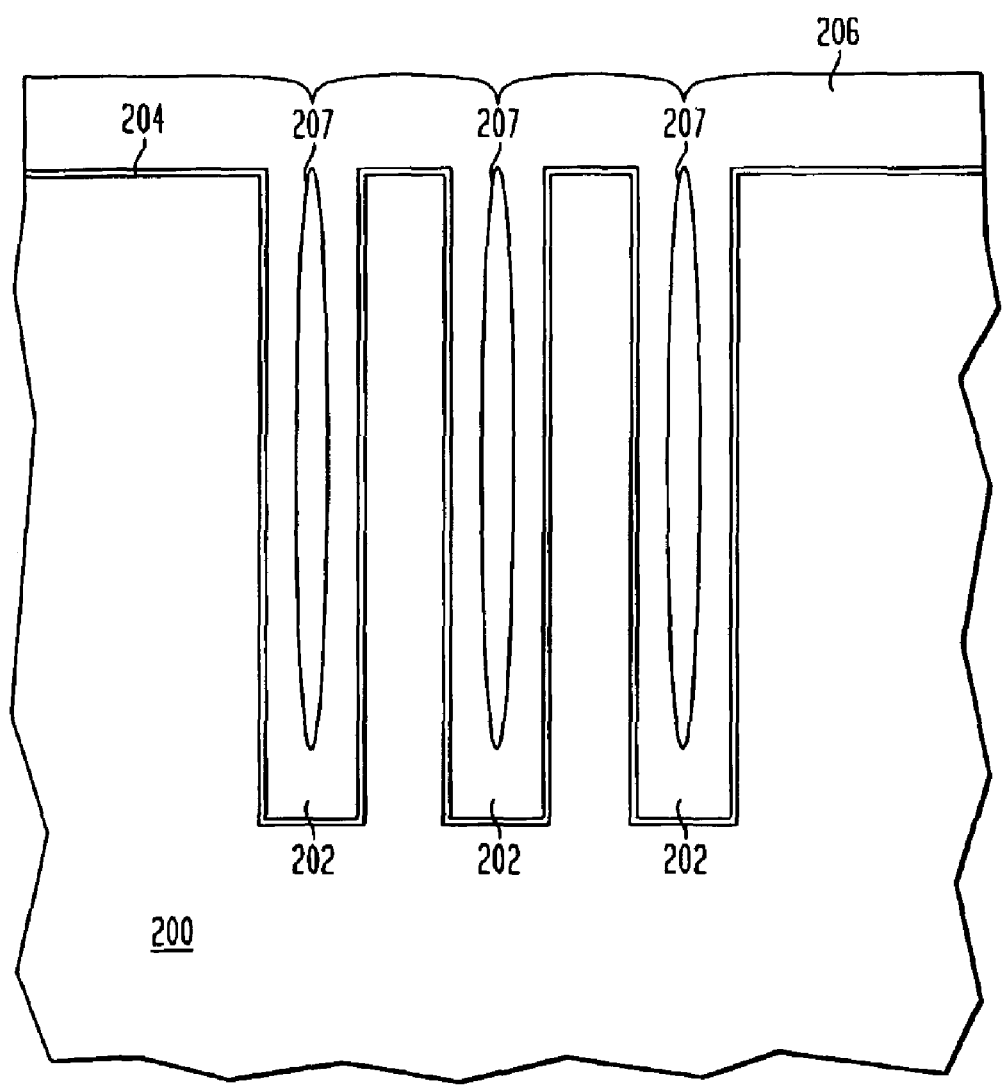

Next, as shown in FIG. 2C, a layer of doped oxide material 206 is deposited that fills the trenches 202 and also covers the top surface of the substrate. The doped oxide typically has a minimum thickness of about half the trench width. Typically, a layer of BPSG is deposited using a CVD process or other known methods, though other reflowable films, such as BSG or ion implanted glass, may be employed. The reflowable material can be intermixed and/or layered with a mobile ion gettering material, such as PSG, arsenic-based glass, or ion implanted glass. For example, BPSG is a mix of reflowable material (BSG) and ion gettering material (PSG) The amount of boron in BPSG determines its ability to flow while the amount of phosphorous determines its ion gettering property. The concentration of boron and phosphorous in the doped oxide can be adjusted independently. The preferred boron concentration in BPSG is from 1 to 10 percent weight while the preferred concentration of phosphorous is from 0.1 to 10 percent weight. The total concentration of dopants is typically kept below about 10 percent weight.

Figure 2D:
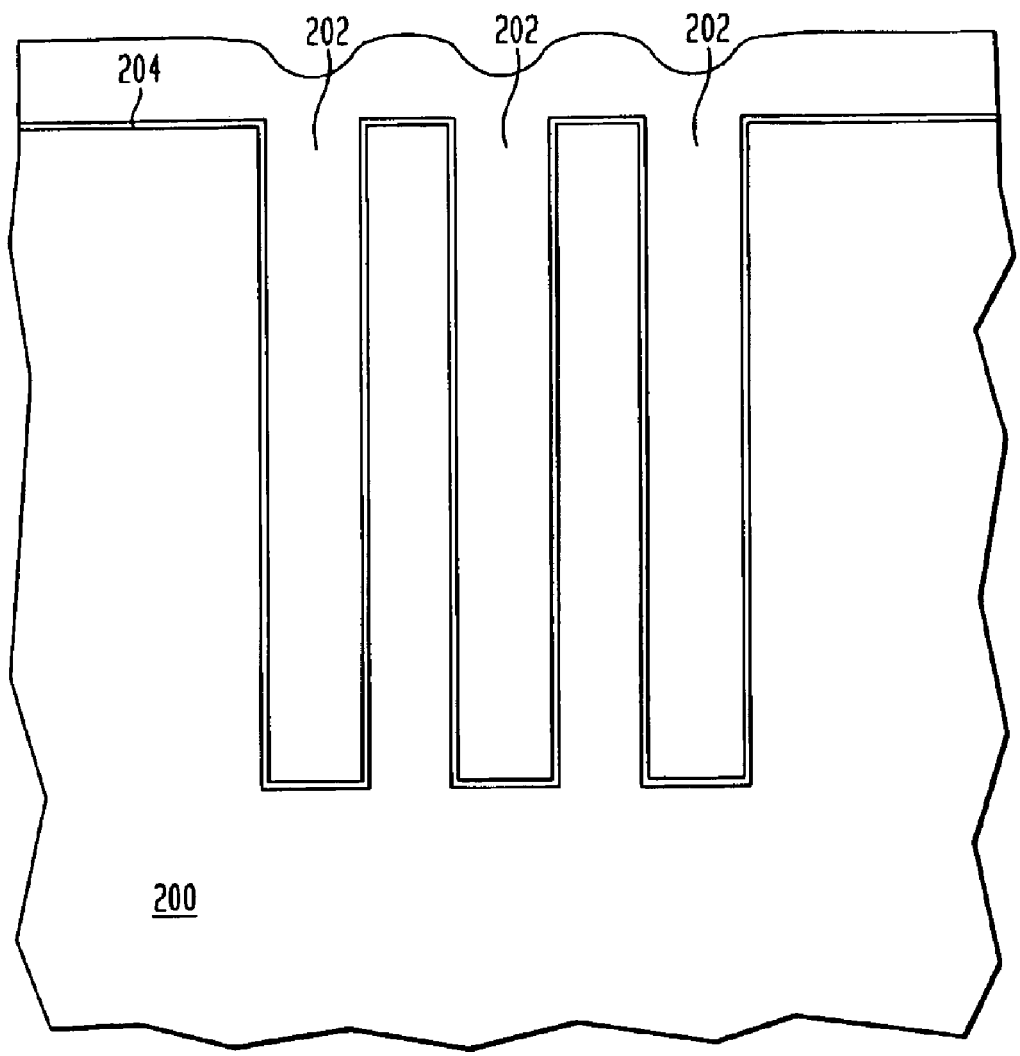

Because of the high aspect ratio of the trenches, voids 207 are often present in the doped oxide layer 206 within the trenches 202. To remove these voids, the substrate is annealed at a temperature of 800° C. or higher to reflow the doped oxide layer 206, as FIG. 2D shows. The reflow step is preferably carried out at a temperature of 900° C. for about 10 minutes or longer in a batch-type furnace or, alternatively, at a temperature of 1000° C. for about 1 minute in a single-wafer RTP reactor.

Figure 2E:
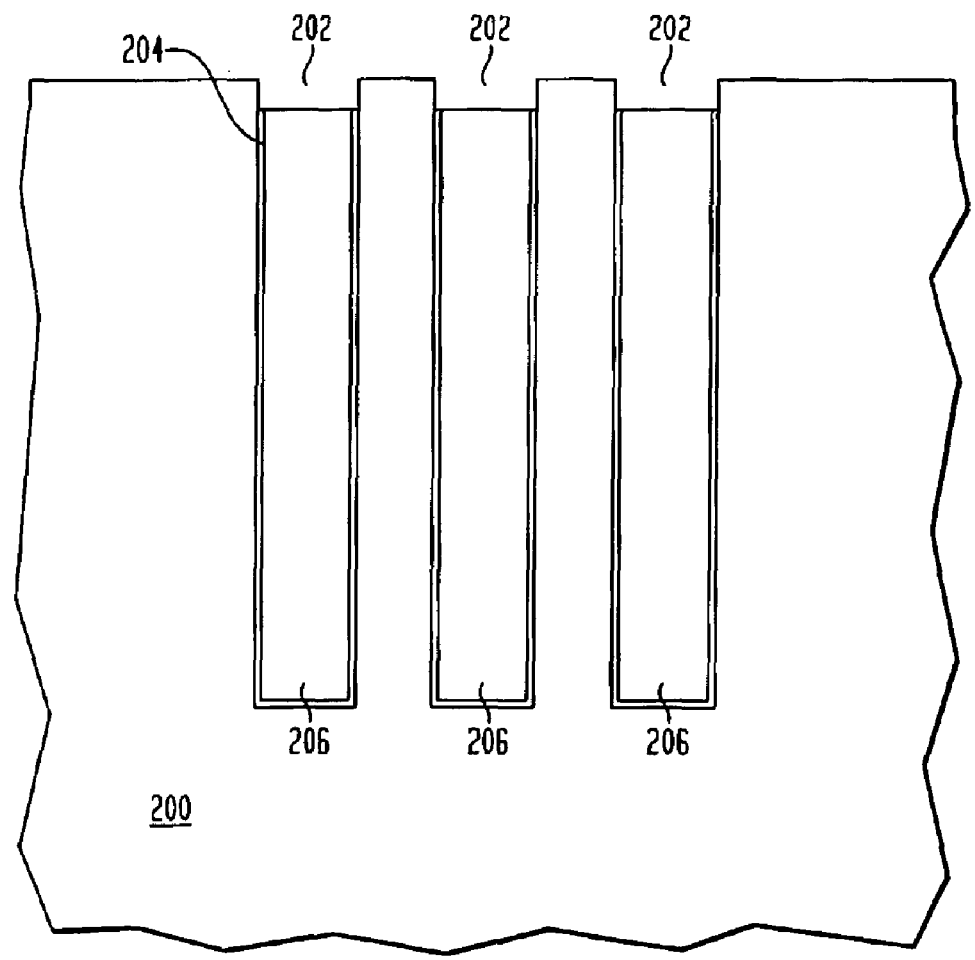

A wet etching step is then carried out, as shown in FIG. 2E. The wet etch removes the part of the doped oxide layer 206 and the liner layer 204 that is atop the substrate 200. Also, the wet etch removes a small portion of the doped oxide layer and the liner layer from the uppermost portion of the trenches 202. Typically, about a 500–1000 Å thick portion of the doped oxide is removed from the top of the trench. Alternatively, a dry etch or a combination of chemical mechanical polishing (CMP) followed by either a dry or wet etch can be also employed.

Isolation trenches filled with a high tensile stress material are highly undesirable because they are a source of numerous dislocations, which contributes to the leakage current. Thus, the remaining BPSG film advantageously exhibits a relatively low tensile stress of less than about +1 Gdyne/$cm^2$, in contrast to the much higher tensile stress of the more typically used spin-on-glass (SOG) material which typically exhibits a tensile stress on the order of +2 to +5 Gdyne/$cm^2$ after a high-temperature anneal.

Figure 2F:
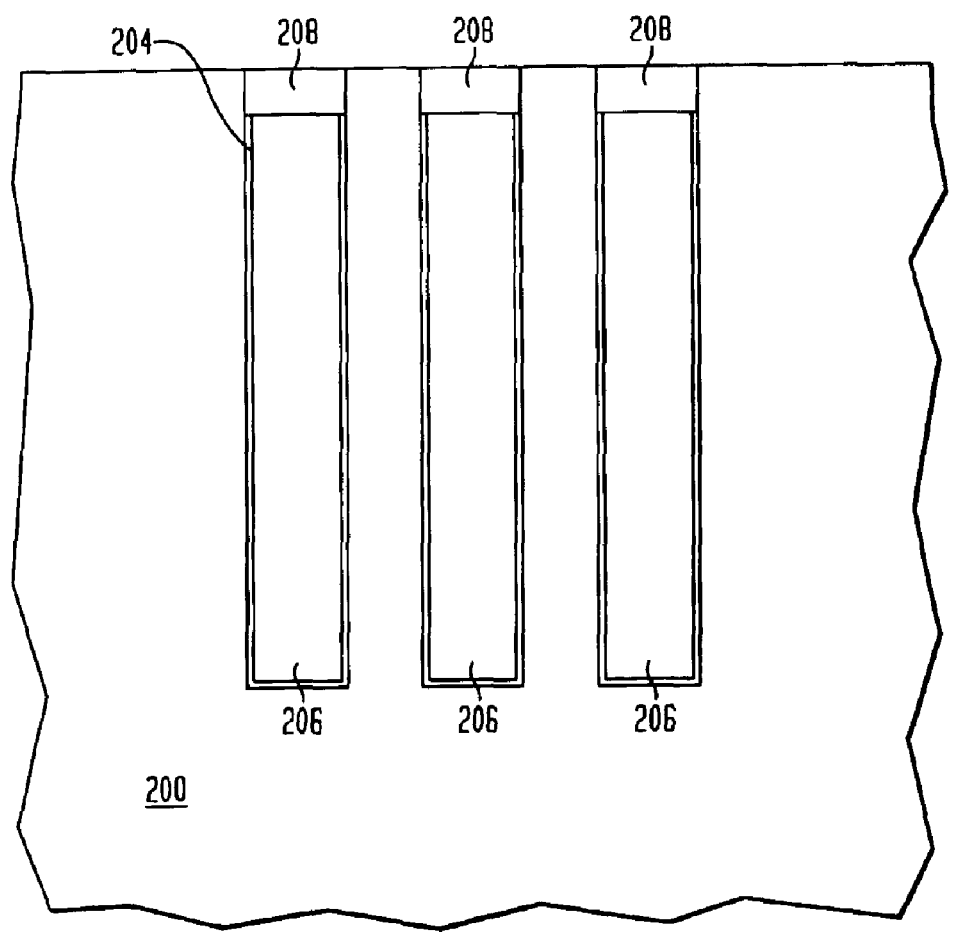
Figure 4:
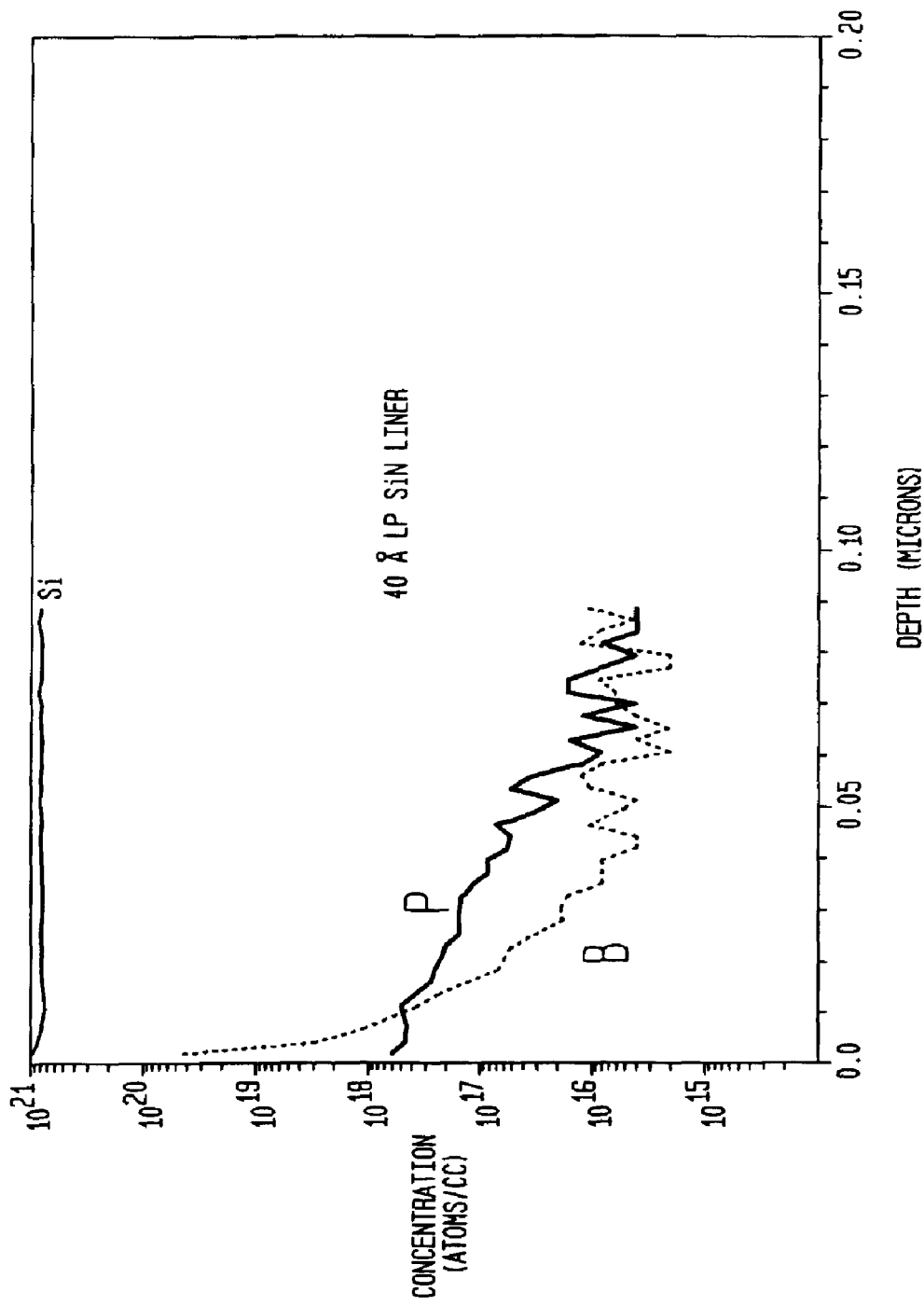
FIG. 4 shows SIMS depth profiles of phosphorus (P) and boron (B) concentrations in a crystalline silicon substrate after a 1050° C., 30 second anneal of a BPSG layer that is separated from the substrate by a 40 Å thick layer of SiN.

Thereafter, as FIG. 2F shows, a capping layer 208 is deposited to fill the part of the trench where the doped oxide was removed. The capping layer 208 is typically a 500–1000 Å thick layer of HDP oxide, though other oxide materials such as TEOS may be deposited using a thermal process or chemical vapor deposition (CVD). Thicker films are also useful depending on the initial thickness of the doped oxide, the trench depth, and the range of trench dimensions present in the substrate. An HDP oxide is preferred because of its compressive stress of about −1 to −2 Gdyne/$cm^2$ which offsets a moderate tensile stress in the doped oxide layer. As a result, the overall tensile stress in the trench film material is reduced, thereby decreasing the probability of dislocation creation in the substrate 100.

Typically, the capping layer is deposited both in the trenches 202 and on the top surface of the substrate 200, and then the portion of the capping layer that is located atop the top surface of the substrate and that is located above the top of the trenches is removed by chemical mechanical polishing (CMP) or other planarization methods. Subsequently the etch mask layer, typically SiN, may be removed by wet etching.

High-speed logic transistors are typically fabricated in the substrate after forming the isolation structure and require at least one high-temperature step to activate the dopants that define the transistor regions. A typical dopant activation step is conducted in an RTP reactor at a temperature from 950° C. to 1050° C. for 1–30 seconds. Other high-temperature steps may also be needed in the post-isolation region fabrication sequence, such as thermal oxidation steps, reflow anneals, silicidation anneals, and high-temperature CVD deposition steps. Therefore, an isolation structure must be compatible with such high-temperature steps. The oxide dopants present in the lower portion of the isolation structure should be contained within the structure, and penetration of the oxide dopants through the liner 104 into the substrate 100 should not interfere with the useful structures of substrate 100.

For example, the oxide dopants should not alter the dopant type of the well in which the isolation structure resides. Although a dopant well may have a non-uniform three-dimensional dopant profile, the minimum dopant concentration in the vicinity of the isolation structure is most crucial. A typical minimal background concentration of dopant in a well ranges from about 5E17 $cm^{-3}$ to about 1E18 $cm^{-3}$. Therefore, the concentration of n-type dopants (e.g. P or As) that penetrate from the doped oxide into a P-well should be limited to about 3E17 $cm^{-3}$. A similar criterion can be established for p-type dopants (e.g. B) that penetrate from the doped oxide into an N-well. For a CMOS circuit, where the same isolation structure is typically used for both the P-wells and the N-wells, the concentration of oxide dopants that penetrate into a substrate during high-temperature steps should not exceed a concentration level of 3E17 $cm^{-3}$.

In a DRAM-based circuit where two types of isolation structures may be used, namely one in the DRAM array and one in the CMOS logic circuitry, the criteria of oxide dopant confinement may be different for each dopant. One such situation is a vertical transistor DRAM cell where the vertical pass transistor typically resides in a P-well. The limit for n-type dopants (e.g. P, As) is 3E17 $cm^{-3}$, as set forth above. However, the p-type dopants (e.g. B) can increase the background concentration of dopants in the well without changing well type. Therefore, the need for p-type dopant confinement is substantially less so that the concentration of p-type dopants that penetrate into P-well during high-temperature steps should not exceed a concentration level of 3E18 $cm^{-3}$, which is slightly higher than a typical background concentration of dopants in the P-well. The relaxed criterion for P-wells is significant because boron, which is a typical p-type dopant, diffuses much faster than either arsenic or phosphorous, which are typical n-type dopants.

The dopant confinement criteria can be also specified in terms of a dopant dose that penetrates into the substrate. The dopant dose is defined as the amount of dopant diffused into the substrate through a unit area of the diffusion barrier and is measured using a blanket wafer (one-dimensional) doping. Typically, a dose of approximately 1E11 $cm^{-2}$ roughly corresponds to a concentration limit of 3E17 $cm^{-3}$, whereas a dose of approximately 1E12 $cm^{-2}$ roughly corresponds to the concentration limit of 3E18 $cm^{-3}$. Accordingly, the respective confinement criteria can be defined in terms of the dopant doses of 1E11 $cm^{-2}$ and 1E12 $cm^{-2}$.

FIGS. 3–6 show depth profiles of phosphorus (P) and boron (B) concentrations in a crystalline silicon substrate after a 1050° C., 30 second anneal of a BPSG layer that is separated from the substrate by a layer of SiN having thicknesses of 20 Å, 40 Å, 60 Å, and 80 Å, respectively, the depth profiles are made using secondary ion mass spectroscopy (SIMS). The BPSG layer and the thin SiN barrier are removed from the processed water prior to measuring the SIMS profiles. Also, a thin native oxide (~10 Å) is formed at the sample surface due to exposure to moisture that can accumulate a relatively large amount of boron. Therefore, a large measured surface concentration of boron could be a sample preparation artifact. As a result, the dopant dose criterion is a preferred way to judge the strength of the barriers.

Figure 5:
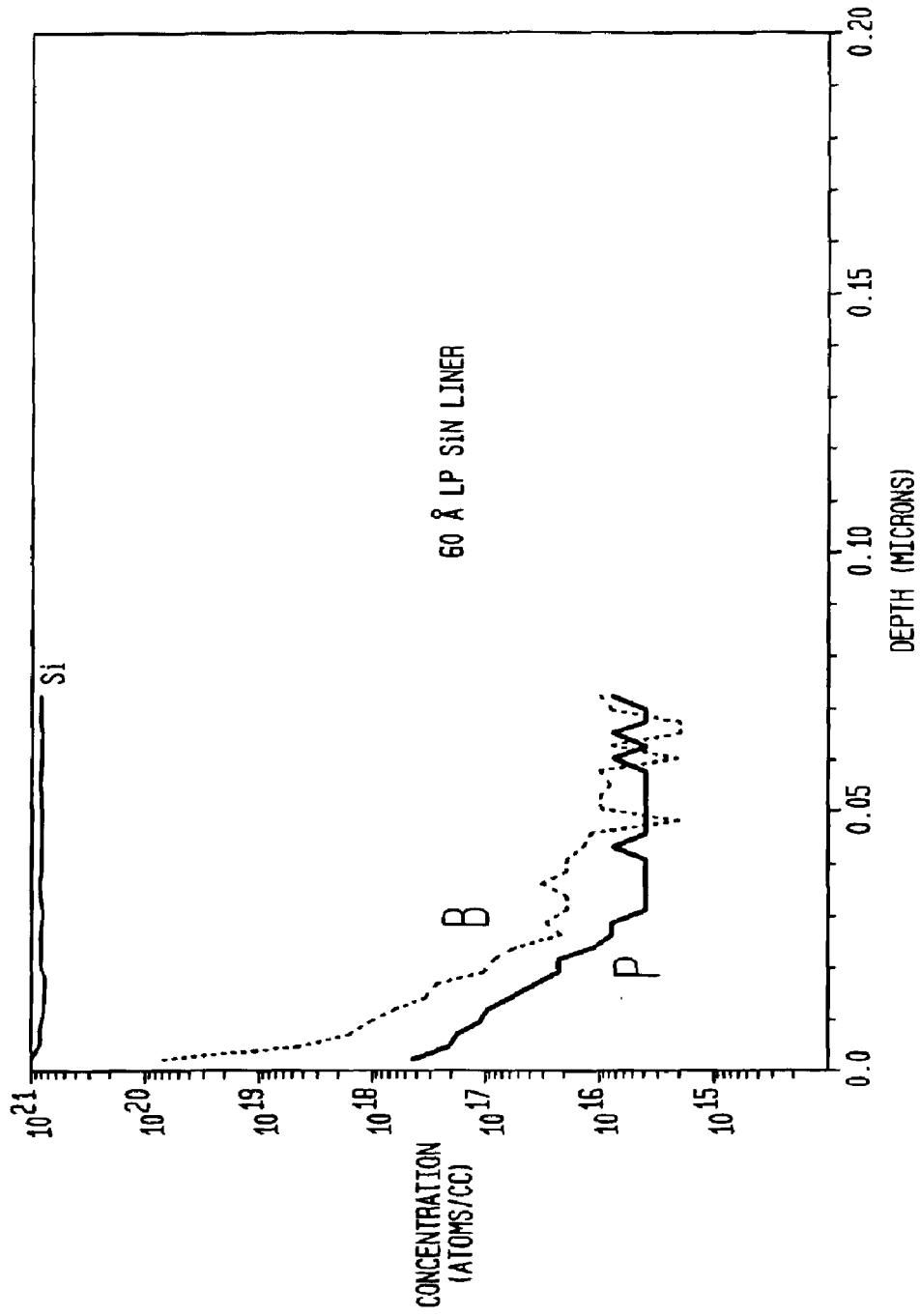
FIG. 5 show SIMS depth profiles of phosphorus (P) and boron (B) concentrations in a crystalline silicon substrate after a 1050° C. 30 second anneal of a BPSG layer that is separated from the substrate by a 60 Å thick layer of SiN.
Figure 6:
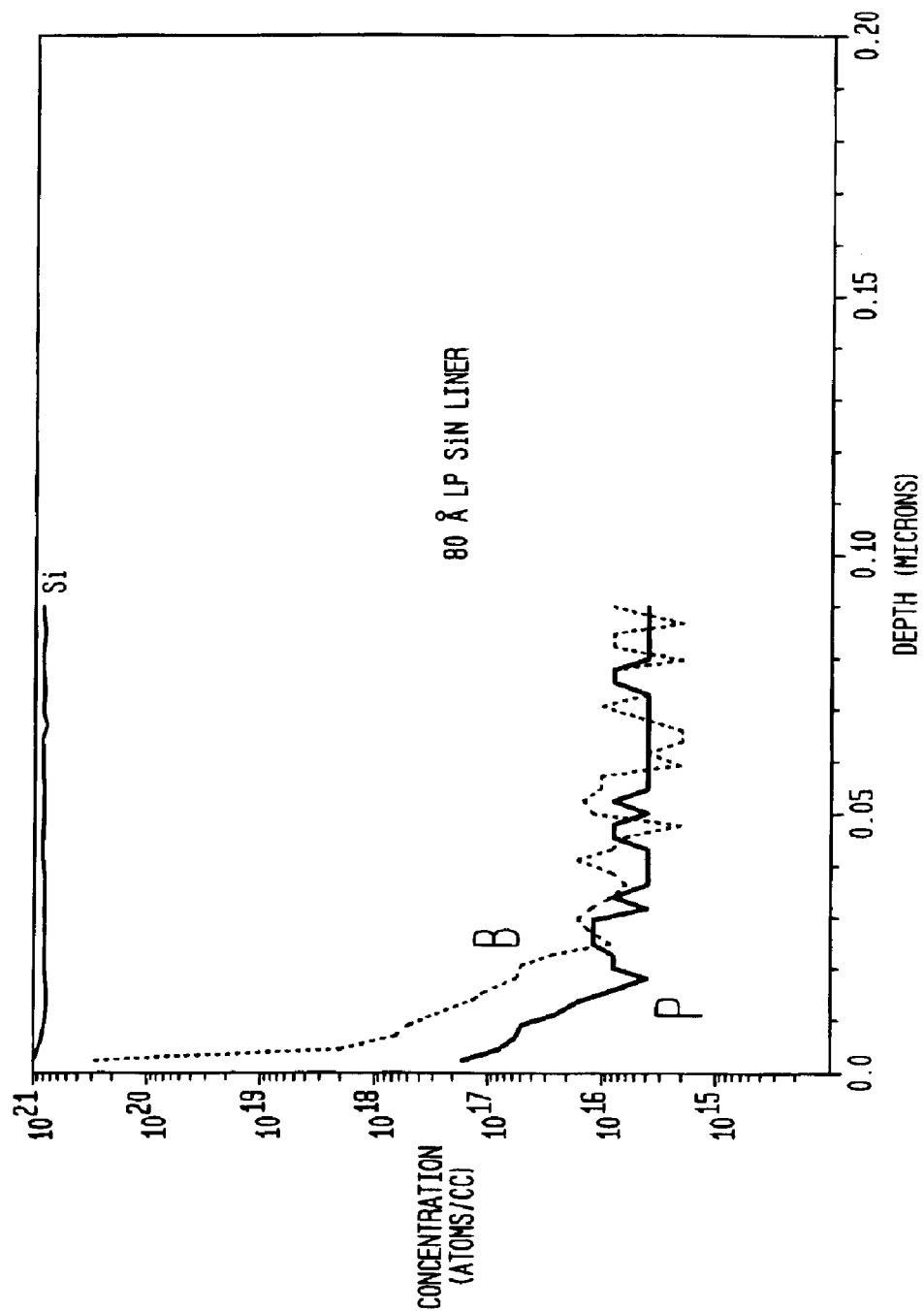
FIG. 6 shows SIMS depth profiles of phosphorus (P) and boron (B) concentrations in a crystalline silicon substrate after a 1050° C., 30 second anneal of a BPSG layer that is separated from the substrate with a 80 Å thick layer of SiN.

FIG. 5 shows that the 60 Å thick SiN barrier is an insufficient barrier for 1050° C., 30 second activation step, whereas FIG. 6 illustrates that a 80 Å SiN barrier is sufficient for the N-well. Here, a 1050° C., 30 second thermal budget represents a worse case, whereas a typical junction activation thermal budget is about or below 1000° C., and 30 seconds. The strength of the diffusion barrier depends exponentially on temperature. Consequently, a 50° C. drop in temperature relaxes the requirement on diffusion barrier thickness by about 40% for a typical activation energy of 3 eV. Accordingly, the N-well protection criterion can be satisfied with a 50 Å-thick SiN barrier.

Figure 7:
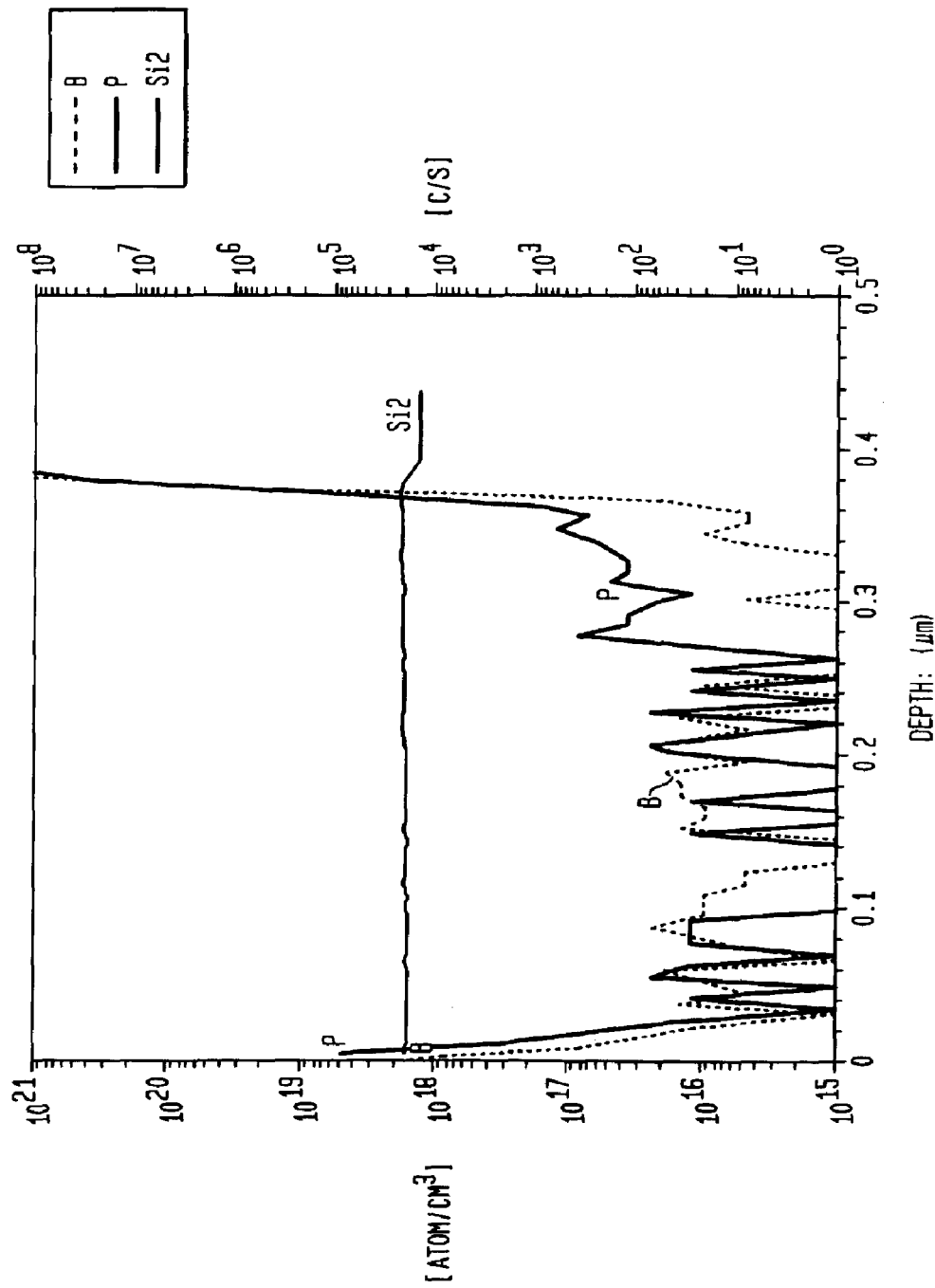
FIG. 7 shows SIMS depth profiles of phosphorus (P) and boron (B) concentrations in a crystalline silicon substrate having a HDP oxide cap after a 800° C., 10 minute anneal and a 1050° C., 90 second anneal of a BPSG layer that is covered by the HDP oxide cap.

FIG. 7 shows a SIMS depth profile of phosphorus (P) and boron (B) in a HDP oxide cap after consecutive 800° C., 10 minute and 1050° C., 90 second anneals of a BPSG layer that is covered with a 400 nm HDP cap. The dopant penetration into the HDP cap does not exceed 100 nm at such an extreme thermal budget. The dopant level in the remaining 300 nm of the cap is below the detection limit. Accordingly, a 100 nm thick HDP cap is sufficient to effectively block dopant penetration up to the top surface of the isolation trench.

The ability of mobile ions to freely diffuse through a nitride barrier 204 and accumulate or getter in the BPSG layer 206 is shown in another experiment illustrated in Table 1. Here, a thick BPSG gettering layer is separated from a mobile ion source layer using a silicon nitride barrier layer having either a 5 nm or a 12 nm thickness. The mobile ion source used here is a layer of deposited silicon oxide that was previously exposed to a contaminated photoresist to simulate the typical amounts of sodium and potassium ions contamination present in contaminated oxide, namely about 1E11 $cm^{-2}$ to 4E10 $cm^{-2}$, though the manner in which the contamination is introduced is not critical. The samples are then subjected to a typical junction activation anneal sequence at a temperature of no more than 1000° C. As a control sample, contamination of the top deposited oxide layer was omitted, and an about 300 nm thick layer of BPSG was further included between the 12 nm SiN barrier and the deposited oxide. The control sample is also subjected to a standard anneal sequence. The distribution of sodium and potassium is then analyzed using the SIMS technique.

Table 1 shows the amount of contamination in units of atoms per unit area in each of the three layers, namely (1) a contamination source (the contaminated deposited oxide), (2) a diffusion barrier, and (3) a BPSG getter layer. As noted above, for the control sample, the barrier included both a SiN film and a top BPSG layer. The typical sequence of anneals includes a junction activation anneal of 1000° C. for several tens of seconds and a furnace reflow/oxidation anneal at 600–800° C. for several tens of minutes. For a 5 nm thick SiN barrier, all ions are gettered by the BPSG layer leaving the original source of contamination virtually ion free. For a 12 nm thick SiN barrier, most of ions are left in the original source. Thus, the 5 nm thick SiN layer is transparent to the mobile ions whereas the 12 nm thick SiN layer prevents ion gettering by the BPSG layer. Accordingly, the thickness of silicon nitride liner 204 can be chosen such that it substantially blocks the oxide dopant penetration into the transistor well while providing little resistance to the diffusion of mobile ions.

Thus, the trench structure of the invention has the advantage that the trench is filled with a material which can be reflowed to remove any voids or seams that are formed therein except for a thin liner layer on the sidewalls and bottom of the trench and a thin capping layer at the top of the trench. As a further advantage, the liner layer and the capping layer prevent the diffusion of dopants from the doped oxide material to the substrate and any devices formed therein during reflow or other thermal processing. As yet another advantage, the capping layer protects the doped oxide layer from damage during any subsequent wet etching steps.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

said substrate, patterning and etching said masking layer to expose portions of said substrate, and etching said exposed portions of said substrate to form said opening in said substrate.

4. The method of claim 1 wherein a depth-to-width aspect ratio of said opening in said substrate is at least 5:1.

5. The method of claim 1 wherein said liner layer comprises a silicon nitride (SiN) layer.

6. The method of claim 1 wherein said liner layer has a thickness of at least 60 Å.

7. The method of claim 1 wherein said layer of doped oxide material is selected from the group consisting of: a borophosphosilicate glass (BPSG), a borosilicate glass (BSG), a phosphosilicate glass (PSG), an arsenic doped glass, or an ion implanted oxide.

8. The method of claim 1 wherein said depositing step deposits a layer of doped oxide material that has a thickness which is at least twice a depth of said trench.

9. The method of claim 1 wherein said annealing step includes reheating said substrate at a temperature of at least 800° C. for at least 10 minutes.

TABLE 1

| Structure | Na+ (ions/cm$^2$) | | | K+ (ions/cm$^2$) | | |
| --- | --- | --- | --- | --- | --- | --- |
| | Contamination Source Layer | Diffusion Barrier Layer | BPSG Getter Layer | Contamination Source Layer | Diffusion Barrier Layer | BPSG Getter Layer |
| ion source, 12-nm SiN, BPSG getter | 3.0E10 | 1.7E10 | 5.3E9 | 4.6E10 | 4.6E9 | 1.6E9 |
| ion source, 5-nm SiN, BPSG getter | 3E7 | 4.8E7 | 1.4E11 | 1E7 | 1E7 | 2.5E10 |
| 300-nm BPSG (no ionic source), 12-nm SiN, BPSG getter | 7E8 | 9.7E9 | 1.2E9 | 3.9E8 | 8.4E8 | 2E9 |

417500_1.DOC

What is claimed is:

1. A method of forming a trench isolation structure in a substrate, said method comprising:

forming at least one opening in a surface of said substrate;

depositing a liner layer at least along a bottom and sidewalls of said opening;

depositing a layer of doped oxide material at least in said opening;

annealing said substrate to reflow said layer of doped oxide material within said opening;

removing, from said layer of doped oxide material located in said opening in said surface of said substance, an about 500 to 1,000 Å thick portion near said surface of said substrate;

depositing an about 500 to 1,000 Å cap layer at least atop a remaining portion of said layer of doped oxide material; and removing a portion of said cap layer that is atop said surface of said substrate such that said cap layer remains in said opening in said surface of said substrate.

2. The method of claim 1 wherein said substrate comprises a semiconductor material.

3. The method of claim 1 wherein said step of forming an opening includes forming a masking layer on a surface of 10. The method of claim 1 wherein said step of removing said portion of said layer of doped oxide material includes wet etching said substrate to remove said upper portion of said layer of doped oxide material in said opening.

11. The method of claim 1 wherein said step of removing said portion of said layer of doped oxide material includes removing a further portion of said layer of doped oxide material that is atop said surface of said substrate.

12. The method of claim 1 wherein said step of removing said portion of said layer of doped oxide material includes removing a portion of said liner layer in said opening in said surface of said substrate.

13. The method of claim 1 wherein said step of removing said portion of said layer of doped oxide material includes removing a portion of said liner layer that is atop said surface of said substrate.

14. The method of claim 1 wherein said step of depositing a cap layer includes a high-density plasma (HDP) deposition of a layer of oxide.

15. A method of forming a trench isolation structure in a substrate, said method comprising:

forming at least one opening in a surface of said substrate, said opening in said substrate having a depth-to-width aspect ratio of at least 5:1;

depositing a silicon nitride (SiN) liner layer at least along a bottom and sidewalls of said opening, said SiN liner layer having a thickness of at least 60 Å;

depositing a layer of doped oxide material in said opening;

annealing said substrate at a temperature of at least 800° C. for at least 10 minutes to reflow said layer of doped oxide material within said opening;

removing, from said layer of doped oxide material located in said opening in said surface of said substrate, an about 500 to 1,000 Å thick portion near said surface of said substrate; and depositing, an about 500 to 1,000 Å thick layer of high-density plasma (HDP) deposited oxide at least atop a remaining portion of said layer of doped oxide material; and removing a portion of said cap layer that is atop said surface of said substrate such that said cap layer remains in said opening in said surface of said substrate.

* * * * *